United States Patent [19]
Zeewy

[11] 3,737,731
[45] June 5, 1973

[54] FLASHING CIRCUIT

[76] Inventor: Abraham Zeewy, 2328 Canterbury Road, University Heights, Ohio 44118

[22] Filed: Apr. 5, 1971

[21] Appl. No.: 131,291

[52] U.S. Cl. ................331/111, 315/200 A, 315/238, 315/241 R, 340/248, 340/331
[51] Int. Cl. ..........................H03k 3/281, H05b 41/34
[58] Field of Search ........................315/200 R, 200 A, 315/238, 241 R; 331/111; 340/249, 331; 307/311, 252 F; 313/108 D; 250/217 SS

[56] References Cited

UNITED STATES PATENTS

| | | | |
|---|---|---|---|
| 3,611,204 | 10/1971 | Boenning et al | 331/111 |
| 2,968,770 | 1/1961 | Sylvan | 331/111 |

OTHER PUBLICATIONS

General Electric Application Note 90.70 11/67, November 1967, p. 2.
Krajewski, "Photosensing Using GaAs Light Emitting Diode", IBM Technical Disclosure Bulletin, July 1966, P. 202.

*Primary Examiner*—Roy Lake
*Assistant Examiner*—Siegfried H. Grimm
*Attorney*—Yount & Tarolli

[57] ABSTRACT

A flashing circuit in which a capacitor is charged through a path whose conductivity varies with the applied voltage across the path. The path includes a transistor whose input current is a function of the applied voltage when the capacitor charges to a predetermined potential; a programmable unijunction transistor breaks down to discharge current from the capacitor through a light-emitting diode. The breakdown of the unijunction transistor applies a change in bias to the base of the transistor in the charging path so as to minimize the charging current and also effects the cutoff of a second transistor in the discharging path and which is in parallel with the light-emitting diode to cause all capacitor current to flow through the light-emitting diode.

11 Claims, 2 Drawing Figures

INVENTOR
ABRAHAM ZEEWY

BY Yount and Tarolli
ATTORNEYS

FLASHING CIRCUIT

The present invention relates to relaxation oscillator circuits and more particularly to such a circuit which is useful as a flashing-type indicator which is energized from a battery or other source of D.C. voltage or D.C. current.

One of the objects of the present invention is to provide a new and improved relaxation oscillator which has improved minimum power requirements over known devices thereby enabling the device to be used for long periods from a battery supply.

A further object of the present invention is to provide a new and improved flashing indicator circuit which may be used as a battery level indicator in which the change in frequency of flashing of the circuit for a given change in voltage is accentuated.

A further object of the present invention is to provide a new and improved circuit for charging a capacitor, discharging the capacitor through a light-emitting element in which the discharge of the capacitor is used to stop the conduction of semiconductor means through which the capacitor is charged.

A further object of the present invention is to provide a new and improved flashing circuit in which a transistor is connected across a light-emitting element through which a capacitor is periodically discharged, the transistor's collector current being cut off in response to the triggering of a voltage breakdown element for discharging the capacitor to assure that the total current from the discharge of the capacitor is used to energize the light-emitting element.

A further object of the present invention is to provide a new and improved flashing circuit in which a transistor is connected across a light-emitting element through which a capacitor is periodically discharged, the transistor controlling the input current to a second transistor in the charging path for the capacitor, the transistor in the charging path being cut off in response to the triggering of a voltage breakdown element for discharging the capacitor to minimize the flow of charging current during the capacitor discharging interval.

Figure 1:
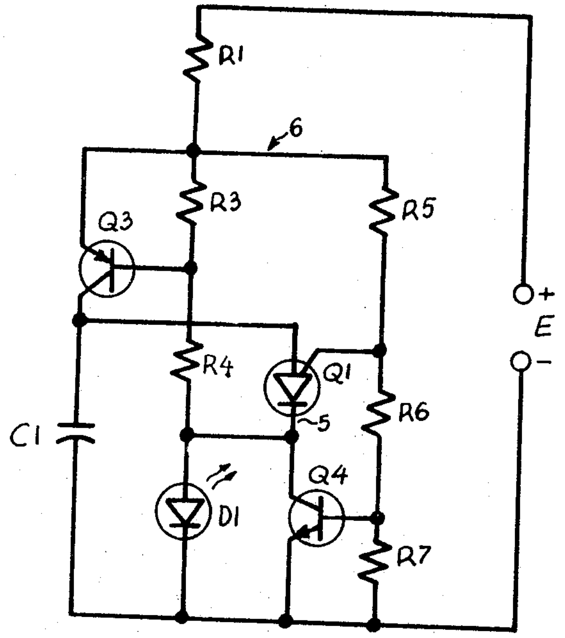
Figure 2:
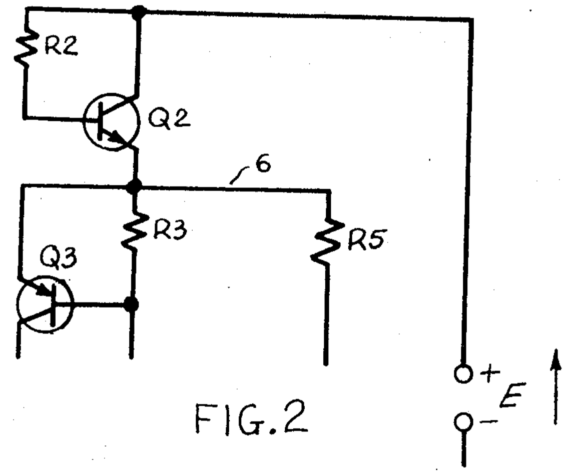

Further objects and advantages of the present invention will be apparent from the following detailed description thereof made with reference to the accompanying drawings forming a part of the present specification for all subject matter disclosed therein and in which:

FIG. 1 is a schematic circuit diagram of a preferred embodiment of my invention; and FIG. 2 is a modification of the circuit of FIG. 1.

Referring to the drawings, a capacitor C1 is to be charged and then discharged through a light-emitting diode D1 to provide a flashing light. The capacitor is charged from a direct current source E, such as a battery, through a charging path which includes a resistor R1 and the emitter-collector path of a PNP transistor Q3, the capacitor C1 having one side connected directly to the negative side of the power supply and the other side connected directly to the collector of transistor Q3.

A biasing circuit is provided for the transistor Q3 to turn the transistor on to effect a charging of the capacitor C1. The biasing circuit for the transistor Q3 includes a resistor R3 connected between the emitter and base of the transistor Q3 and a resistor R4 which connects the base of the transistor Q3 to the negative side of the power supply through the collector-emitter path of an NPN transistor Q4, the transistor Q4 having its emitter connected directly to the negative side of the power supply E and its collector connected to the resistor R4. Base current for the transistor Q3 will flow through the resistor R4 and the collector-emitter path of the transistor Q4 provided the latter is biased to a conductive condition. The transistor Q4 is biased to a conductive condition by a biasing circuit 6 connected to a junction between the resistances R1 and R3 and which comprises series-connected resistors R5, R6, and R7 with R7 being connected to the negative side of the power supply and R5 being connected to the junction between the resistors R1, R3.

The base of the transistor Q4 is connected to a junction between the resistors R6, R7 and input current flows through the resistors R1, R5, R6 and the base-emitter circuit of the transistor Q4 to render the latter conductive to in turn allow base current to flow in the transistor Q3. This renders the emitter-collector circuit of transistor Q3 conductive and allows the capacitor C1 to be charged from the power supply E. When the transistor Q4 is conductive, the voltage drop across the transistor is such that the light-emitting diode is extinguished and non-conductive.

When the charge on the capacitor C1 reaches a predetermined level, a programmable unijunction transistor (PUT) Q1 will become conductive to discharge the capacitor through the light-emitting diode D1. The unijunction transistor Q1 has an anode connected to the positive side of the capacitor C1 and a cathode 5 connected to the anode of the light-emitting diode D1, preferably a gallium arsenide type of diode. The transistor Q1 also has a gate connected to a junction between the resistors R5 and R6. The voltage of the gate determines the breakdown voltage for the transistor Q1 and this voltage may be adjusted by adjusting the relative values of the resistances in the biasing circuit 6.

When the unijunction transistor Q1 breaks down, its gate voltage at the junction between R5 and R6 decreases. This swing of the gate voltage causes the voltage at the junction between R6 and R7 to decrease far enough to cut off the transistor Q4 so that the current through the transistor Q1 from the capacitor C1 flows only through the light-emitting diode D1. The voltage across the light-emitting diode will be sufficiently high to raise the voltage of the base of transistor Q3 to a point which will render the transistor Q3 non-conductive as long as the diode remains in conduction. The diode will remain in conduction until the capacitor discharge current is no longer able to keep transistor Q1 and diode D1 conductive. When the transistor Q1 and diode D1 become non-conductive, transistor Q4 will be again rendered conductive through the biasing circuit 6 to again render the transistor Q3 conductive. This starts a new charging cycle. Thus, it can be seen that the gate voltage of the transistor Q1 switches the control transistor Q4 off and on as the breakdown transistor switches between conductive and non-conductive states to in turn switch the charging transistor on and off so that current does not flow through the collector-emitter circuit of transistor Q3 during discharge of the capacitor.

In operation, the conductivity of transistor Q3 when it is charging the capacitor C1 will vary with the voltage of the source E, because the voltage across R3 will vary. Since this is true, the charging rate for the capacitor C1 will change, as the voltage of source E changes, at a greater rate than would be the case if the capacitor C1 were charged through a circuit of fixed conductivity. Accordingly, the frequency of a flashing will have wider changes for a given change in voltage than would be the case otherwise. This amplification is particularly useful when the circuit is used to measure small changes in voltage.

I have found that the power requirements of the circuit are extremely low and that the circuit provides for a long battery life which makes it useful in battery-operated displays as well as for indicating battery level.

FIG. 2 illustrates a modification of the charging circuit, for use when the device is employed to indicate, by its flashing frequency, changes in output from an external source E. In FIG. 2, R1 is replaced by a current source designated as transistor Q2 and resistor R2. The remainder of the circuit of FIG. 2 is the same. The modification of FIG. 2 will provide for a great variation in the voltage at point 6, as the current from source E varies. Variations in voltage at point 6 in turn control the frequency of flashing.

While the present invention has been described as being connected to a battery, it will be understood that the power sources may be any direct current power source.

It will be understood that the present invention may be made as an integrated circuit package. Moreover, the circuitry is sufficiently compact that together with an operating battery it may be used in ornamental jewelry, such as a tie clasp or ear ring. For such a use, the battery would be inserted in a case together with the circuitry except that the light-emitting diode would be exposed. To render the jewelry attachable to the clothing of a person, the case may be provided with a clip or pin.

What is claimed is:

1. An electrical circuit comprising a capacitor to be charged, a capacitor discharge circuit connected across said capacitor and including a voltage breakdown device, a charging circuit for said capacitor including a semiconductor means having load terminals connected in series in the charging circuit and having a control terminal for controlling the conductivity between the load terminals in response to a control signal, and first circuit means for establishing a control signal at the control terminal and responsive to a breakdown of said voltage breakdown device to decrease the conductivity of the semiconductor means to reduce current flow in the charging circuit and responsive to cessation of current in said voltage breakdown device to increase the conductivity of the semiconductor means to increase current flow in the charging circuit, said first circuit means including the collector-emitter path of a control transistor, and second circuit means responsive to the breakdown of said voltage breakdown device to render said control transistor non-conductive and responsive to cessation of current in said voltage breakdown device to render said control transistor conductive.

2. An electrical circuit as defined in claim 1 wherein a light-emitting diode is connected across said transistor and in series with said voltage breakdown device, the voltage drop across said diode when conducting being such to render said semiconductor means non-conductive.

3. An electrical circuit as defined in claim 1 wherein said voltage breakdown device is a programmable unijunction transistor having a gate connected to said second circuit means, the gate voltage of said unijunction transistor rendering said control transistor non-conductive on conduction of said voltage breakdown device.

4. An electrical circuit as defined in claim 3 wherein a light-emitting diode is connected across said transistor and in series with said voltage breakdown device, the voltage drop across said diode when conducting being such to render said semiconductor means non-conductive.

5. An electrical circuit as defined in claim 1 and in which said voltage breakdown device is a programmable unijunction transistor, and said first circuit means is connected with a gate electrode of said programmable unijunction transistor and is responsive to a voltage of said gate electrode for establishing said control signal.

6. An electrical circuit as defined in claim 1 and wherein said capacitor discharge circuit includes an electrical load in parallel with said transistor and in series with said voltage breakdown device, said electrical load being energized by discharge current flowing from said capacitor.

7. An electrical circuit as defined in claim 16 and wherein said electrical load comprises a light-emitting diode.

8. A electrical circuit comprising a capacitor to be charged, a capacitor discharge circuit connected across said capacitor and including a voltage breakdown device, a charging circuit for said capacitor including a semiconductor means having load terminals connected in series in the charging circuit and having a control terminal for controlling the conductivity between the load terminals in response to a control signal, and first circuit means for establishing a control signal at the control terminal and responsive to a breakdown of said voltage breakdown device to decrease the conductivity of the semiconductor means to reduce current flow in the charging circuit and responsive to cessation of current flow in said capacitor discharge circuit to increase the conductivity of the semiconductor means to increase current flow in the charging circuit, and wherein said capacitor is charged from an electrical source having an electrical output, and said semiconductor means comprises a transistor whose collector-to-emitter conductivity during charging is controlled by said control signal, said control signal being dependent upon the magnitude of said output.

9. A circuit as defined in claim 8 in which said charging circuit comprises a second transistor amplifier connected to be responsive to changes in output from said source to amplify changes in charging current in response to changes in said output.

10. An electrical circuit comprising a capacitor to be charged, a capacitor discharge circuit connected across said capacitor and including a voltage breakdown device, a charging circuit for said capacitor including a semiconductor means having load terminals connected in series in the charging circuit and having a control terminal for controlling the conductivity between the load terminals in response to a control signal, and first circuit means for establishing a control signal at the control terminal and responsive to a breakdown of said voltage breakdown device to decrease the conductivity of the semiconductor means to reduce current flow in the charging circuit and responsive to cessation of current in said capacitor discharge circuit to increase the conductivity of the semiconductor means to increase current flow in the charging circuit, and wherein said voltage breakdown device is a programmable unijunction transistor having a gate, and said first circuit means comprises control means responsive to the voltage of said gate.

11. An electrical circuit comprising a capacitor to be charged, a capacitor discharge circuit connected in parallel combination with said capacitor and including a voltage breakdown device, a charging circuit for said capacitor connected in series with the parallel-connected combination of said capacitor and said discharge circuit and including an element actuatable to substantially block flow of current in the charging circuit and energizable and de-energizable to control current in said charging circuit, and control means responsive to the breakdown of said voltage breakdown device to actuate said element for blocking flow of current in said charging circuit and responsive to cessation of current in said voltage breakdown device to actuate said element for conduction of current in said charging circuit, said control means comprising a semiconductor device, and means for rendering said semiconductor device non-conductive on the breakdown of said voltage breakdown device and conductive upon cessation of current in said voltage breakdown device to conduct current when said capacitor is charging, and wherein a light-emitting diode is connected in series with said voltage breakdown device and said semiconductor device is connected across said diode.

* * * * *